(12) United States Patent
Koay et al.

(10) Patent No.: US 6,242,280 B1
(45) Date of Patent: Jun. 5, 2001

(54) METHOD OF INTERCONNECTING AN ELECTRONIC DEVICE

(75) Inventors: Huck Khim Koay; Cheng Why Tan; Chee Keong Chong; Gurbir Singh; Sundar A L Natarajan Yoganandan; Seong Choon Lim, all of Penang (MY)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/343,329

(22) Filed: Jun. 30, 1999

(51) Int. Cl.[7] .................................................. H01L 21/44
(52) U.S. Cl. ........................... 438/106; 438/617; 438/618
(58) Field of Search .................................. 438/612–617, 438/455–461, 24, 27, 30, 128; 257/702, 703, 704

(56) References Cited

U.S. PATENT DOCUMENTS

| 4,600,138 | 7/1986 | Hill . | |
|---|---|---|---|
| 5,731,244 | * 3/1998 | Evers | 438/617 |
| 5,751,060 | * 5/1998 | Laine et al. | 257/702 |

* cited by examiner

*Primary Examiner*—David Nelms
*Assistant Examiner*—Dung A Le

(57) ABSTRACT

A method of interconnecting bond pads on a semiconductor die to leads of a package is disclosed. The method includes placing a connector over each bond pad and its corresponding lead. The connector is one of a plurality of ganged connectors. The method also includes electrically connecting the connector to the bond pad and the lead and singularizing the connector from the plurality of ganged connectors. Such a method of interconnection has the advantage of simultaneously interconnecting multiple bond pads to leads. In a preferred embodiment, light-emitting diodes (LEDs) are manufactured using the method. A PCB is etched to produced lead pairs of the LEDs. A semiconductor die is attached to a first lead of each lead pair. Ganged interconnects are aligned with and tagged onto the dies and the second leads of the lead pairs, thereby electrically connecting them. After tagging, the interconnects are singularized. An encapsulant is applied on each die and interconnect. Each die, interconnect and lead pair are then separated to form individual LEDs.

10 Claims, 3 Drawing Sheets

US 6,242,280 B1

METHOD OF INTERCONNECTING AN ELECTRONIC DEVICE

FIELD OF INVENTION

This invention relates to a method for interconnecting an electronic device to leads of an integrated circuit package. More particularly, this invention relates to a method for simultaneouly interconnecting light-emitting diodes to surface-mounted leads.

BACKGROUND

Wire-bonding is a common method used for interconnecting integrated circuits and electronic devices to leads. A typical apparatus and method for forming wire bonds between contacts or bond pads on integrated circuit dies and dies of electronic devices, and corresponding leads is illustrated in U.S. Pat. No. 4,600,138. As disclosed in the U.S. patent, a bond head is shown moving from a first bonding location to a second bonding location. An end of a wire is bonded to the first bonding location by the bond head. The bond head moves vertically away from the first bonding location to draw a length of wire necessary to make a wire bond. The bond head is then moved to the second bonding location with subsequent bonding of the wire to the second bonding location. The bond head is then used to pull and subsequently break away the remaining wire from the second bonding location. Thereafter, the bond head is ready to be moved to another first bonding location for effecting another wire bond.

Typically, the bond head is heated to assist the formation of the wire bond. The heat and subsequent pressure applied by the bond head fuse the end of the wire to the contact or bond pad. Ultrasonic vibration in conjunction with a heated bond head may also be used to effect a wire bond. Typically, a single bond head is used for making all of the wire bonds of the integrated circuits and electronic devices. As should be recognized by those skilled in the art, such an operation is inherently mechanical in nature and thus disadvantageously limits the speed with which interconnections can be made.

In addition to the disadvantage of the speed limitation of the sequential process of wire bonding, there is another disadvantage associated with wire bonding especially when used in the manufacturing of a light-emitting diode (LED) to bond the LED die to a lead.

Typically in the manufacturing process of an LED, the connection of a die to a lead is provided by threading a wire through a standard wire bonding capillary in a bond head and heating the end of the wire to form a ball. The ball is applied to a bond pad on the die and is bonded to the bond pad. The capillary is then moved to a lead with the wire being threaded through the capillary until the wire has reached the lead. The wire is then stitch bonded to the lead. In making the connection, the wire is looped above the bond pad at the neck to minimize stress on the wire. Despite such care to reduce stress at the neck and the stitch, the likelihood of damage to the wire, such as cracking during the rigorous conditions of surface-mounting-technology (SMT) soldering and during usage is high. As temperature changes during such processes, the die and the encapsulant expand and contract at different rates. These different expansion rates stress the neck and the stitch of the wire bond mechanically. These stresses are high especially when the LED is operated at elevated temperatures of more than 150 degree Celsius. To curb such temperature excursions during LED operation, the amount of current drawn by the LED has to be limited.

Another disadvantage associated with wire bonding in the manufacturing of tiny SMT LEDs is the difficulty in achieving fine pitch bonding due to the relatively large size of the bond head.

The foregoing therefore creates the need for a method for making faster and more reliable interconnection than what can be achieved with wire bonding. In the manufacturing of an LED, there is also a need to provide a stronger and more robust interconnection between a die to a lead.

SUMMARY

In one aspect, the present invention provides a method for interconnecting semiconductor dies to associated leads substantially concurrently. The method includes placing the dies in a first predetermined pattern in proximity to associated leads for interconnection on a first sheet. Connectors are formed in a second predetermined pattern on a second sheet. The first and the second sheets are aligned for concurrently interconnecting of the dies to their associated leads using the connectors. Each connector electrically connects a die and its associated lead. After being electrically connected to the die and its associated lead, each connector is singularized to separate the connector from the second sheet.

In another aspect, an embodiment of a semiconductor device is manufactured using the above method. The semiconductor device includes a die connected to an associated lead. From the above method of concurrently interconnecting dies to associated leads, an additional step of singularizing a die and its associated lead from the first sheet is required to result in the semiconductor device.

BRIEF DESCRIPTION OF DRAWINGS

The invention will be better understood with reference to the drawings, in which.

DETAILED DESCRIPTION OF THE PREFERRED EMBODIMENT

Figure 1:
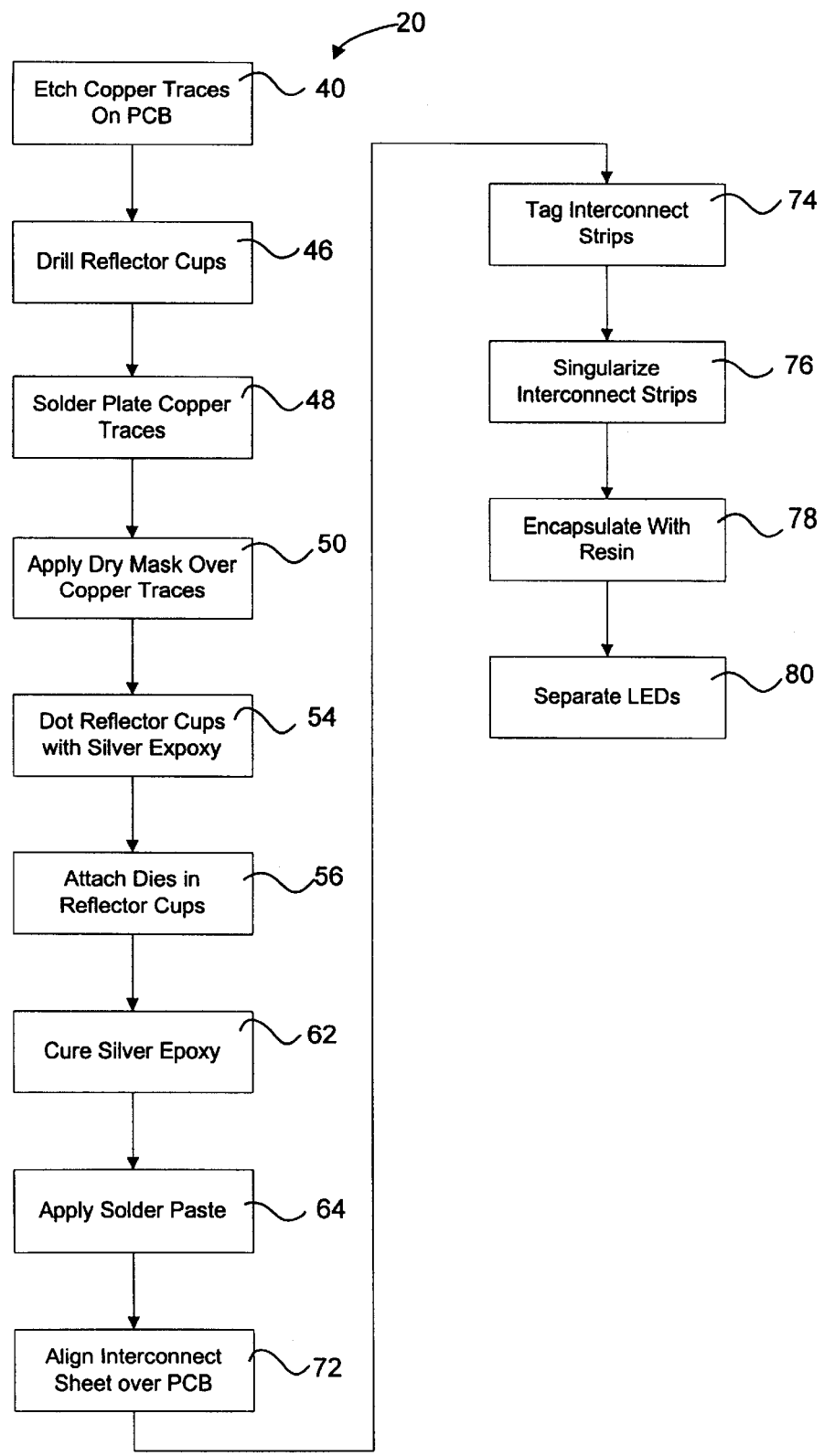
FIG. 1 is a block diagram of steps involved in a process of manufacturing surface-mounted LEDs using the present invention.
Figure 2:
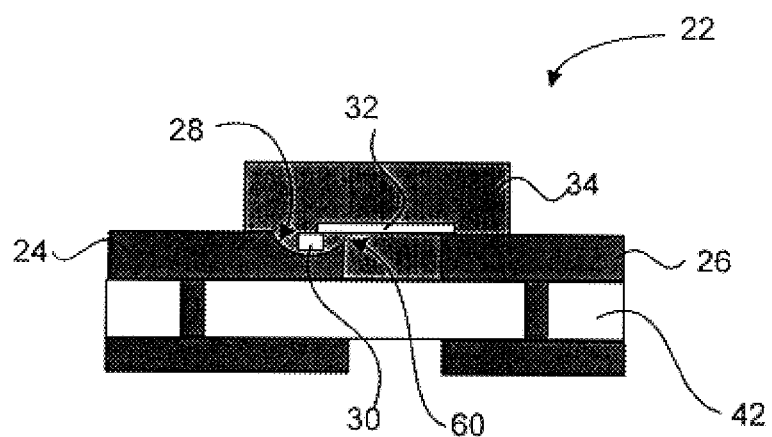
FIG. 2 is a cross-section view of a surface-mounted LED manufactured according to the process of FIG. 1.

The method of interconnection according to the present invention is described in a process for manufacturing surface-mounted LEDs. FIG. 1 is a block diagram showing a typical sequence 20 of process steps according to the invention as used in the manufacturing of surface-mounted LEDs. FIG. 2 is a cross-sectional view of a surface-mounted LED 22 resulting from such a process. The LED 22 has a first lead 24 and a second lead 26. On the first lead is a depression 28; the surface of which serves as a reflector. This depression is commonly known in the art as a reflector cup 28. A light emitting diode die 30 is placed in this reflector cup 28. A first electrode (not shown) of the die 30 is electrically attached to the bottom of the reflector cup 28. A second electrode (not shown) of the die 30 is connected to the second lead 26 via an electrically conductive interconnect strip or connector 32. The entire die 30, interconnect strip 32 and portions of the leads 24, 26 are encapsulated in a transparent or translucent resin 34.

Figure 3:
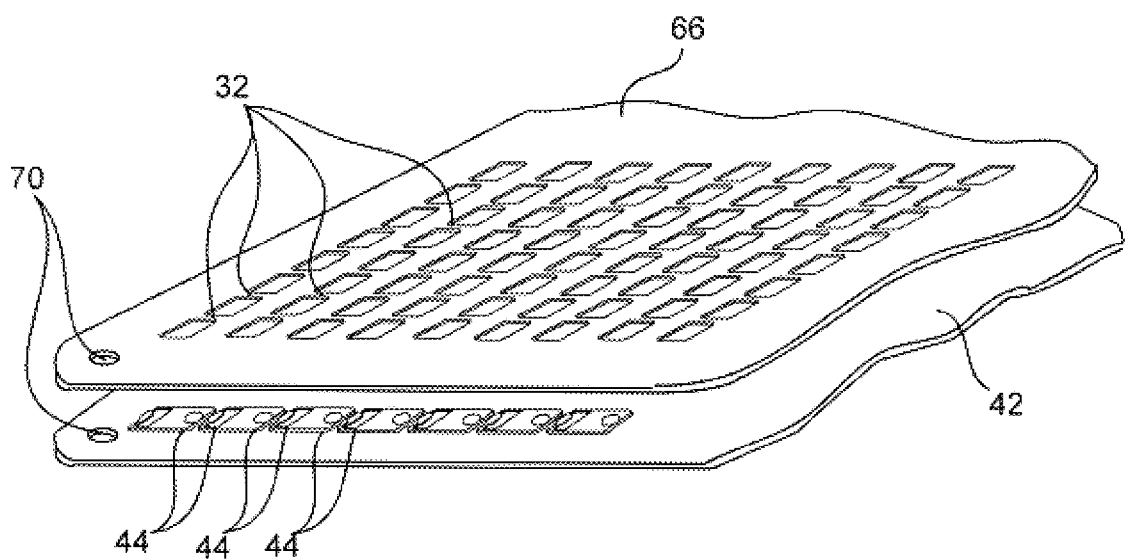
FIG. 3 is an isometric view of a portion of an interconnect sheet containing interconnect strips aligned with a PCB having etched traces forming a plurality of die-reflector-cup-and-lead pairs.
Figure 4:
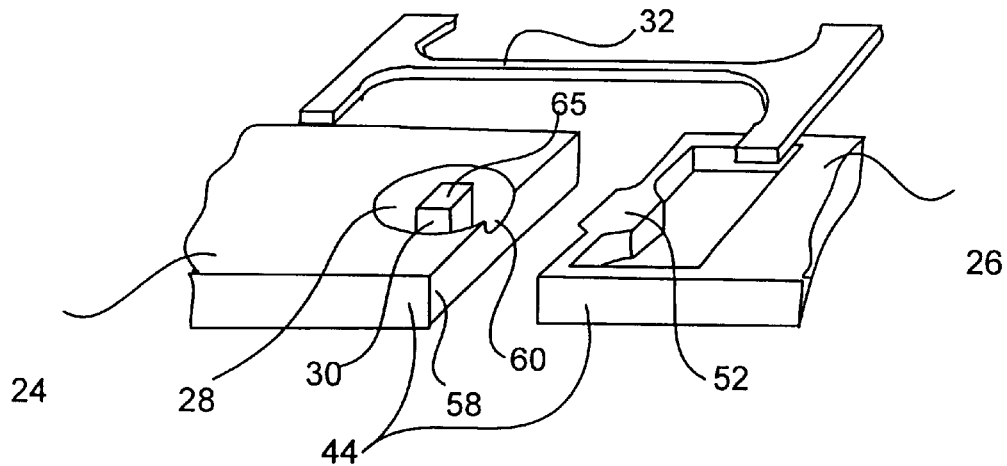
FIG. 4 is an enlarged isometric view of an interconnect strip on the interconnect sheet of FIG. 3 and a die-reflector-cup-and-lead pair on the PCB in FIG. 2.

The sequence 20 of manufacturing such an LED 22 is next described. The sequence starts in an ETCH COPPER TRACES ON PCB step 40, where traces which form the two leads, a die-attach lead 24 and a bond-pad lead 26, of each LED are etched using a conventional process on a surface of a printed circuit board (PCB). FIG. 3 shows a portion of the PCB 42 with several pairs 44 of leads 24, 26. FIG. 4 is an enlarged isometric view of a lead pair 44. The PCB 42 may, for example, be an epoxy/glass laminate, a metal board, a polyester board, a polyamide board, a bismaleimidetraizine (BT) resin board, or a thermosetting polyphenylene ether board. After being etched, the PCB may contain as many as 924 pairs 44 of leads 24, 26 arranged in a 42-by-22 array.

The sequence 20 next proceeds to a DRILL RELECTOR CUPS step 46. In this step, a reflector cup 28 is drilled into a die-attach lead 24 of each lead pair 44. The sequence 20 then proceeds to a SOLDER-PLATE COPPER TRACES step 48, where the copper traces on the PCB are coated with solder. Alternatively, the surface of the copper traces may be nickel-plated. The next step is an APPLY DRY MASK OVER COPPER TRACES step 50, where a thin dry film mask (not shown) is placed over the PCB. Holes on this thin dry film mask align with bond pads 52 on the bond-pad leads 26. The side walls of these holes prevent the run out of solder in a subsequent solder reflowing process step, which will be described later.

After the dry film mask is applied, the next step in the sequence is a DOT REFLECTOR CUPS WITH SILVER EXPOXY step 54. In this step, electrically conductive silver epoxy is applied to the base of the reflector cups 28. The silver epoxy is applied simultaneously to all the reflector cups 28 to increase the efficiency of the process.

The next step is an ATTACH DIES IN REFLECTOR CUPS step 56, where a die 30 is picked and placed on the silver epoxy in each of the reflector cups 28. It is important to drill a reflector cup such that the surface of the reflector cup 28 impinges on a side wall 58 of the die-attach lead 24 to create a clearance gap 60 on the surface of the reflector cup 28. Alternatively, the depth of the reflector cups 28 is made less than the height of the die 30 to prevent an interconnect strip shorting the two leads 24, 26 when connecting the die 30 to the bond-pad lead 26. The sequence next proceeds to a CURE SILVER EPOXY step 62, where the PCB with the attached dies 30 is heated in air at about 183 degree Celsius for a period of about one hour. After this step 62, the silver epoxy cures to attach a first electrode of the die 30 electrically to the base of the reflector cup 28.

The next step is an APPLY SOLDER PASTE step 64, where solder paste preferably of the non-clean-flux type is applied to bond pads 65 on the dies 30 and bond pads 52 on the bond-pad leads 26 exposed by the dry film mask. The solder paste is applied using a squeegee and stencil method known to those skilled in the art. The amount of solder paste used should correspond to a final solder bump size of approximately 2 to 3 mils in diameter and 4 to 5 mils in height. The squeegee forces solder paste to be pushed through holes in the stencil onto the bond pads 52, 65.

Before the description of the process for manufacturing surface-mounted LEDs is continued, the process of making an interconnect sheet is described. FIG. 3 shows a portion of such an interconnect sheet 66. The interconnect sheet 66 is of conductive material such as copper, preferably Beryllium Copper or mild steel, and has a thickness of about 2 mils. This sheet 66 is etched to produce the interconnect strips 32 by any known photochemical fabrication process. One such process requires coating the sheet 66 with a layer of photosensitive resistive material and then covering it with a photomask. The photomask defines covered areas and exposed areas to achieve the final interconnect strips 32 on the sheet 66. The material directly under the photomask remains solvent dissolvable after ultraviolet radiation is applied over the mask. The photoresist layer under the clear area of the photomask is hardened when the photomask-covered sheet is exposed to ultraviolet radiation. The hardened photoresist covers the desired portion, i.e., the strips of the interconnect sheet to form a chemically-resistant etch mask, leaving the unwanted portion to the attack of an etchant, such as a chromic acid solution or ferric chloride. After being etched, the hardened photoresist can be removed by a hot organic stripper. The interconnect strips are then coated with solder. The width of each interconnect strip is approximately 2 mil. It is important to keep the width of the interconnect strips narrow so that they do not interfere with radiation pattern of the dies 30 during operation of the completed LEDs. The forming of interconnect strips out of a single sheet as described results in interconnect strips which are robustly held in place to withstand the rigors of a solder reflow process.

The solder-coated interconnect sheet 66 is aligned with the PCB using dowel pins inserted through alignment holes 70 on the interconnect sheet 66 and the PCB in an ALIGN INTERCONNECT SHEET OVER PCB step 72. A sandwich jig is used to hold the interconnect sheet 66 and PCB 42 close to each other so that height variation of the interconnect strips over the dies 30 and bond pads 52 is reduced. The interconnect strip 66 is stretched taut to prevent faults due to shorting.

Figure 5:
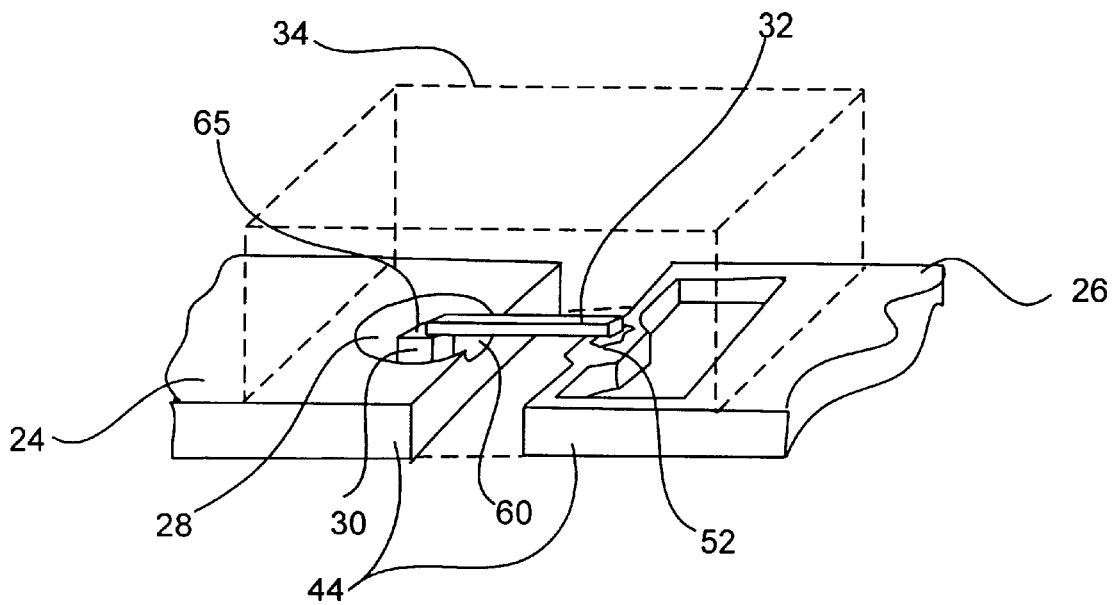
FIG. 5 is an enlarged isometric view of the interconnect strip in FIG. 4 soldered to connect the die to the lead in FIG. 4 with the excess ends of the interconnect strip trimmed.

In a TAG INTERCONNECT STRIPS step 74, the sandwich jig holding the interconnect sheet 66 and the PCB 42 is placed in an oven which is heated to a temperature of approximately 210 degree Celsius. The sandwich jig is heated in the oven at that temperature for a period of about 20 minutes. The heat in the oven reflows the solder paste, thus simultaneously connecting the dies 30 to their corresponding leads 26. Two tag points on each interconnect strip 32 are tagged to bond pads 52, 65 on a die 30 and its corresponding bond-pad lead 26. This step 74 completes the electrical connection of the LED 22. The next step is a SINGULARIZE INTERCONNECT STRIPS step 76, where the interconnect strips 32 are separated from the interconnect sheet. A laser process is used to separate each interconnect strip 32 by focusing a laser beam to sever the ends of the interconnect strip which lie beyond the two tag points. FIG. 5 shows a separated interconnect strip 32 tagged to the die 30 and the bond-pad lead 26. Preferably, a secondary reflow step is performed to let the singulated interconnect strips align themselves.

The sequence next proceeds to an ENCAPSULATE WITH RESIN step 78, where a coating is applied to each die 30. The purpose of this coating is to serve as a barrier layer, preventing moisture and other materials from contacting the die 30 and damaging it. These coatings vary from a soft gel to a hard shell. An optically clear encapsulant 34 is then dispensed over the die 30 and the interconnect strip 32.

Finally, the individual LEDs 22 on the PCB 42 are separated in a SEPARATE LEDS step 80. A dicing saw such as one available from Disco Abrasive Systems Inc., Mountain View, Calif., is used to singularize the LEDs 22.

In the preferred embodiment, the process is described for the manufacturing of surface-mounted LEDs. The method of interconnection however can be used in other electronic devices or integrated circuits for interconnecting dies to leads. For example, the method can be used in interconnecting bonding pads on a die to corresponding leads in a QFP or a BGA package.

As another example, the laser cutting process in the SINGULARIZE INTERCONNECT STRIPS step 76 can be replaced with a step wherein the remainder of the interconnect sheet is simply peeled away to singularize the interconnect strips while leaving them intact on the PCB. Such a process will require that the interconnect strips be designed such that a peeling force that is required to singularize them will not damage the die connections to the die-attach leads and the interconnect strips.

As yet another example, the TAG INTERCONNECT STRIPS step 74 using the oven reflow method may be replaced with another laser process for effecting the tagging. Such a laser tagging process is disclosed in the U.S. Pat. No. 5,872,405.

In the APPLY SOLDER PASTE step, solder paste can also be applied to the interconnect strips instead of the dies and leads on the PCB.

We claim:

1. A method of interconnecting semiconductor dies to associated leads substantially concurrently comprising the steps of:

placing the dies in a first predetermined pattern in proximity to associated leads for interconnection on a first sheet;

forming connectors out of a second sheet of conductive material in a second predetermined pattern;

aligning the first and second sheets for the connectors to make interconnections of the dies to their associated leads concurrently;

effecting electrical connections between the dies and associated leads; and singularizing the connectors to separate them from the second sheet.

2. A method according to claim 1, wherein the step of effecting electrical connections is performed using a laser beam.

3. A method according to claim 1, wherein the singularizing step is performed using a laser beam.

4. A method according to claim 1, wherein the steps of effecting electrical connections and singularizing the connectors are performed simultaneously using a laser beam.

5. A method according to claim 1, wherein the forming step comprises forming connectors out of a sheet of metal.

6. A method according to claim 1, wherein the forming step comprises etching the second sheet of conductive material to form the connectors.

7. A method according to claim 1, wherein the step of effecting electrical connections between the dies and associated leads comprises tagging the connectors, at two separate tag points, to the dies and the associated leads respectively.

8. A method according to claim 7, wherein the singularizing step comprises severing the ends of the connectors which lie beyond the two tag points.

9. A method according to claim 1, wherein the singularizing step comprises severing the ends of the connectors.

10. A method according to claim 1 for interconnecting light emitting diodes to surface mounted leads.

\* \* \* \* \*